US008570079B2

(12) United States Patent
Ferriss et al.

(10) Patent No.: US 8,570,079 B2
(45) Date of Patent: Oct. 29, 2013

(54) REDUCING PHASE LOCKED LOOP PHASE LOCK TIME

(75) Inventors: Mark Ferriss, Tarrytown, NY (US); Alexander V. Rylyakov, Mount Kisco, NY (US); Jose A. Tierno, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 138 days.

(21) Appl. No.: 13/226,557

(22) Filed: Sep. 7, 2011

(65) Prior Publication Data
US 2013/0057327 A1 Mar. 7, 2013

(51) Int. Cl.
*H03L 7/06* (2006.01)

(52) U.S. Cl.
USPC .......................................... 327/156; 327/147

(58) Field of Classification Search
USPC .................................................. 327/147, 156
See application file for complete search history.

(56) References Cited

U.S. PATENT DOCUMENTS

| 5,276,716 | A | 1/1994 | Wincn | |
|---|---|---|---|---|
| 6,222,421 | B1* | 4/2001 | Kiyose | 331/17 |
| 6,356,599 | B1 | 3/2002 | Lee | |
| 6,914,490 | B2* | 7/2005 | Fayneh et al. | 331/16 |
| 7,634,038 | B1 | 12/2009 | Hufford et al. | |
| 7,640,455 | B2* | 12/2009 | Leung et al. | 714/24 |
| 7,894,333 | B2 | 2/2011 | Belotserkovsky | |
| 8,063,707 | B2* | 11/2011 | Wang | 331/11 |
| 8,125,254 | B1* | 2/2012 | Ding | 327/156 |
| 8,259,890 | B2* | 9/2012 | Chen et al. | 375/376 |
| 2002/0041215 | A1* | 4/2002 | Kiyose | 331/57 |
| 2006/0022860 | A1* | 2/2006 | Storvik et al. | 341/155 |
| 2007/0085720 | A1* | 4/2007 | Fosler | 341/155 |
| 2007/0247234 | A1* | 10/2007 | Roper | 331/16 |
| 2009/0013199 | A1* | 1/2009 | Leung et al. | 713/300 |
| 2009/0243660 | A1* | 10/2009 | Lee et al. | 327/7 |
| 2009/0273405 | A1* | 11/2009 | Cowan et al. | 331/109 |
| 2010/0208857 | A1* | 8/2010 | Chen et al. | 375/376 |
| 2010/0283549 | A1* | 11/2010 | Wang | 331/34 |
| 2013/0057327 | A1* | 3/2013 | Ferriss et al. | 327/156 |

FOREIGN PATENT DOCUMENTS

| CN | 1922784 A | 2/2007 |
|---|---|---|
| EP | 0289941 A2 | 4/1988 |
| JP | 62047233 A | 2/1987 |

OTHER PUBLICATIONS

"Dynamic Bandwidth DLL for Optimal Lock-In Time" IPCPM00103546D, Apr. 16, 2005, Abstract (1 page).

* cited by examiner

*Primary Examiner* — Adam Houston
(74) *Attorney, Agent, or Firm* — Tutunjian & Bitetto, P.C.; Anne V. Dougherty

(57) ABSTRACT

There is provided a method for reducing lock time in a phase locked loop. The method includes detecting a saturation condition on a path within the phase locked loop. The method further includes temporarily applying saturation compensation along the path when the saturation condition is detected.

25 Claims, 7 Drawing Sheets

REDUCING PHASE LOCKED LOOP PHASE LOCK TIME

GOVERNMENT RIGHTS

This invention was made with Government support under Contract No.: FA8650-09-C-7924 (Defense Advanced Research Projects Agency (DARPA)). The Government has certain rights in this invention.

BACKGROUND

1. Technical Field

The present invention relates generally to phase locked loops and, in particular, to reducing phase locked loop (PLL) phase lock time.

2. Description of the Related Art

A phase locked loop (PLL) is a control system that aims to generate an output signal having a phase that is related to the phase of an input (i.e., reference) signal. The lock time of a PLL, also known as phase lock time or frequency acquisition time or settling time, is the time that is takes for the phase of the output of the PLL to be locked to (in synchronization with) the phase of the input of the PLL. Of course, it is advantageous that the lock time of a PLL be as small as possible.

FIG. 1 shows a dual path analog phase locked loop (PLL) 100, in accordance with the prior art. The PLL 100 includes a phase-frequency detector (PFD) 110, a charge pump 1 (CP1) 121, a charge pump 2 (CP2) 122, a divider 130, a voltage controlled oscillator 140, a coarse band controller 150, a capacitor 161, a capacitor 162, and a resistor 170.

In this type of PLL, the integral control path 181 and the proportional control path 182 are implemented separately with two separate charge pumps (CP1 and CP2), filters, and VCO control nodes. In PLL 100, CP1 121 is the integral path charge pump and CP2 122 is the proportional charge pump. The VCO 140 oscillates at a frequency which increases in response to an increase in its input signals. The PFD 110 monitors the phase and frequency difference between its two inputs (the reference clock and the output of the divider 130). The divider 130 divides the frequency of the output of the VCO 140 down to a frequency close to that of the input reference.

In a typical implementation, the proportional control path 182 responds to a phase difference at the input of the PLL 100 by generating a voltage at an input of the VCO 140. If the phase difference goes to zero, then that input of the VCO 140 will go to zero. The integral control path 181 integrates the phase difference at the input of the PLL 100. When the phase difference goes to zero, the integral control path 181 does not go to zero, but maintains its value.

A typical VCO has coarse digitally switched tuning bands in addition to the analog controls. PLL 100 includes a typical automatic coarse band selection circuit, also referred to herein as course band controller 150. Course band controller 150 monitors the integral control voltage, and decrements/increments the coarse controls if the integral control voltage is too high/too low.

The coarse tuning bands are typically used to tune the VCO's frequency to within the range of the fine (analog) integral control. Then the integral control path 181 moves the control voltage until the VCO 140 is oscillating at the correct frequency. Under normal use these bands act as an extension to the range of the integral control path 181 of the PLL 100. A set of comparators in the course band controller 150 detects when the integral control voltage goes above its usable range. If the integral control voltage goes too high/low then the VCO coarse control is incremented/decremented. The coarse controls are increment/decrement until the integral control voltage returns to with its usable range.

FIG. 2 shows an s-domain model 200 of a phase locked loop in accordance with the prior art. For example, the s-domain model 200 can be for PLL 100 shown in FIG. 1. Regarding s-domain model 200, K1 201 and K2 202 represent the proportional and integral path gains, Ko 220 represents the VCO gain, Kd 210 represents the PFD gain, and N 240 represents the divider gain. A combiner 231 includes an inverting input and a non-inverting input. A combiner 232 includes two non-inverting inputs. Equation (1) represents the s-domain transfer function between the phase of the input and output of a type II PLL. A type II PLL is defined as a PLL which includes two integrators in its open loop phase domain transfer function. Equations (2) and (3) relate $\omega_n$ and $\zeta$ to the PLL parameters. In particular, $\omega_n$ represents the PLL's natural frequency and $\zeta$ represents the PLL's damping ratio.

$$\frac{\theta_{out}}{\theta_{in}} = \frac{2\zeta\omega_n s + \omega_n^2}{s^2 + 2\zeta\omega_n s + \omega_n^2} \qquad (1)$$

$$\omega_n = \sqrt{K_d K_o K_2} \qquad (2)$$

$$\zeta = \frac{K_1}{2}\sqrt{\frac{K_d K_o}{K_2}} \qquad (3)$$

It can be show that if $\zeta>1$ then the PLL will not exhibit ringing during frequency/phase acquisition. However if $\zeta<1$, then the PLL can exhibit excessive ringing in its transient settling behavior. For this reason, PLLs are rarely designed with $\zeta$ having a value much less than one.

In a dual path PLL (e.g., PLL 100), the proportional control path (e.g., 182) can saturate in the presence of large phase/frequency offsets. If the phase difference at the input of the phase detector is sufficiently large, then the current produced by the charge pump multiplied by the loop filters impedance will be greater that the usable range of the proportional control path.

A saturated proportional control path will have less gain during acquisition than the equivalent unsaturated gain. From Equation (3), we see that if the proportional gain, K1, is reduced, then $\zeta$ is also reduced.

SUMMARY

According to an aspect of the present principles, there is provided a method for reducing lock time in a phase locked loop. The method includes detecting a saturation condition on a path within the phase locked loop. The method further includes temporarily applying saturation compensation along the path when the saturation condition is detected.

According to another aspect of the present principles, there is provided an apparatus for reducing lock time in a phase locked loop. The apparatus includes a saturation compensator for detecting a saturation condition on a path within the phase locked loop, and temporarily applying saturation compensation along the path when the saturation condition is detected.

According to yet another aspect of the present principles, there is provided a computer readable storage medium comprising a computer readable program. The computer readable program when executed on a computer causes the computer to perform the following: detect a saturation condition on a path within the phase locked loop; and temporarily apply saturation compensation along the path when the saturation condition is detected.

According to still another aspect of the present principles, there is provided a method for reducing lock time in a phase locked loop having an integral control path and a proportional control path. The method includes detecting a saturation condition on the proportional control path. The method further includes temporarily applying saturation compensation along the proportional control path when the saturation condition is detected by adjusting a relative gain on the proportional control path. The proportional control path includes a coarse band controller for controlling an oscillator coarse band. The relative gain on the path is adjusted by modulating the oscillator coarse band between an incremented state and an original state to provide at least one of a reduced average frequency change and a reduced average phase change over a given time period as compared to using only the incremented state. The original state corresponds to a non-saturation condition of the proportional control path.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

The present principles are directed to reducing phase locked loop (PLL) phase lock time (frequency acquisition time). Advantageously, the present principles are suitable for any PLL architecture in which the proportional path can saturate in the presence of large phase deviations. Examples of suitable PLLs to which the present principles may be applied include, but are not limited to, dual-path analog or digital PLLs.

In an embodiment of the present principles, the frequency acquisition time of a dual path PLL is reduced by temporarily incrementing/decrementing the coarse bands of the voltage controlled oscillator (VCO) when the proportional voltage goes above/below its unsaturated range. This is the equivalent of extending the proportional path range. A major advantage of this approach is that it requires very little additional circuitry. The VCO's coarse band control circuit already controls the VCO bands. Hence, such additional circuitry pertains to detecting when the proportional path is saturated. As used herein, the phrases "saturated", "saturation", and "saturation condition" all interchangeable refer to when the proportional path control signal has increased/decreased sufficiently far from its nominal position that any further attempt to increase/decrease the control signal will have no effect on the output phase or frequency.

Figure 1:
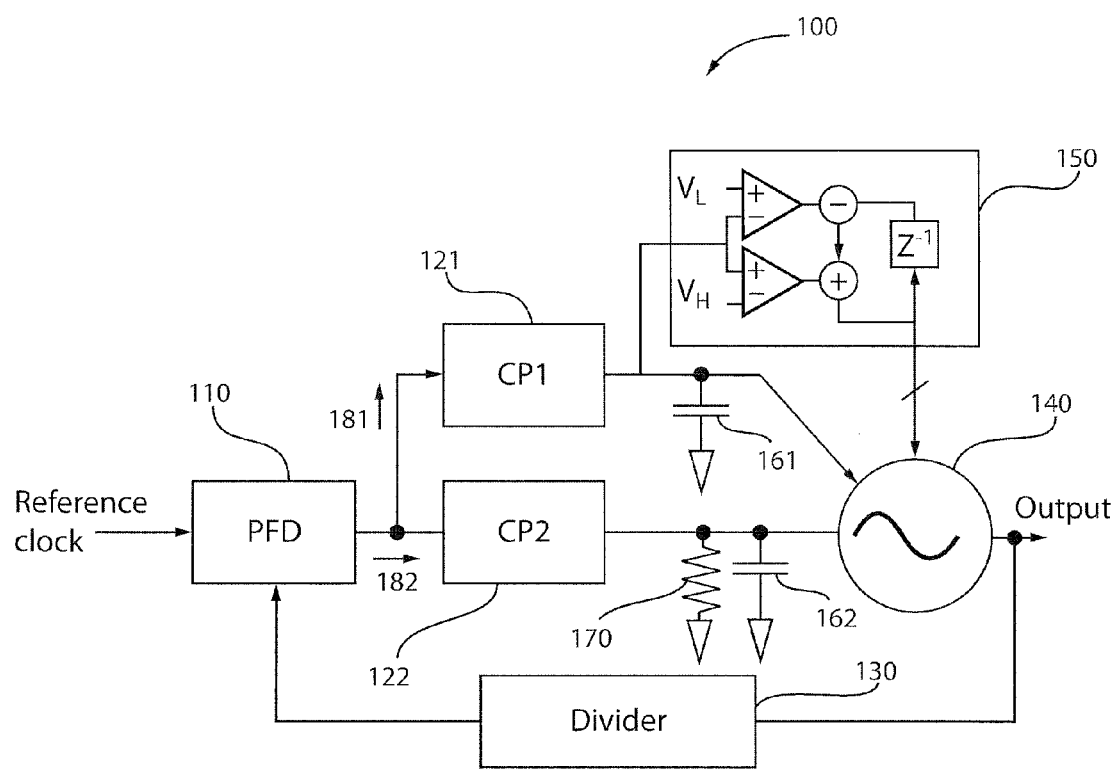
FIG. 1 shows a dual path analog phase locked loop (PLL) 100, in accordance with the prior art.
Figure 2:
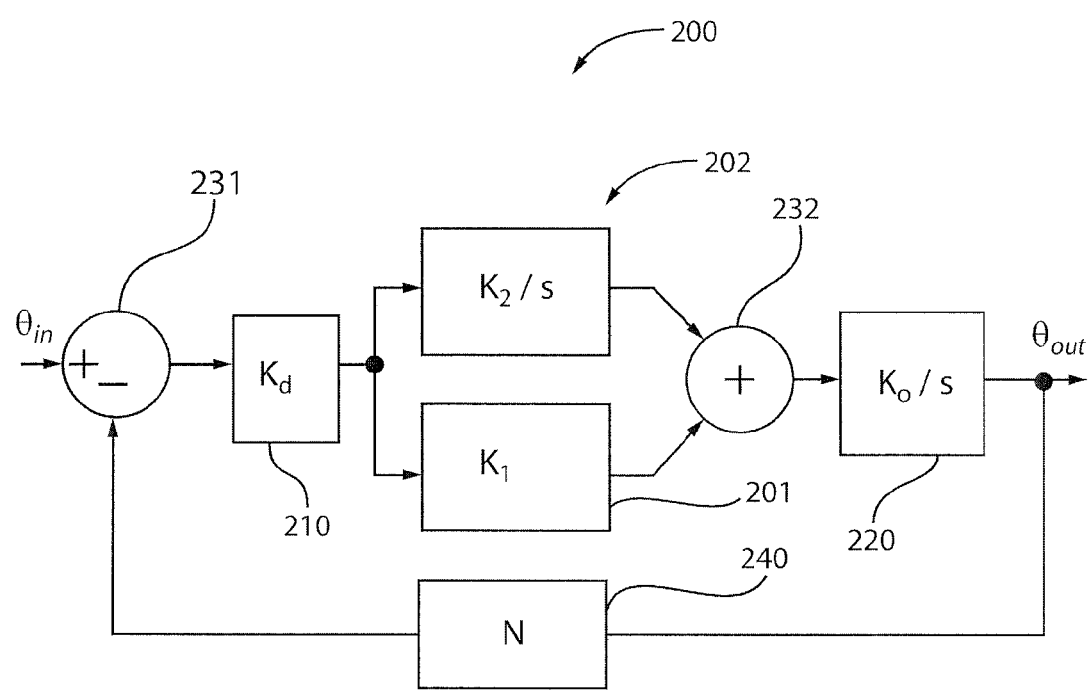
FIG. 2 shows an s-domain model 200 of a phase locked loop in accordance with the prior art.
Figure 3:
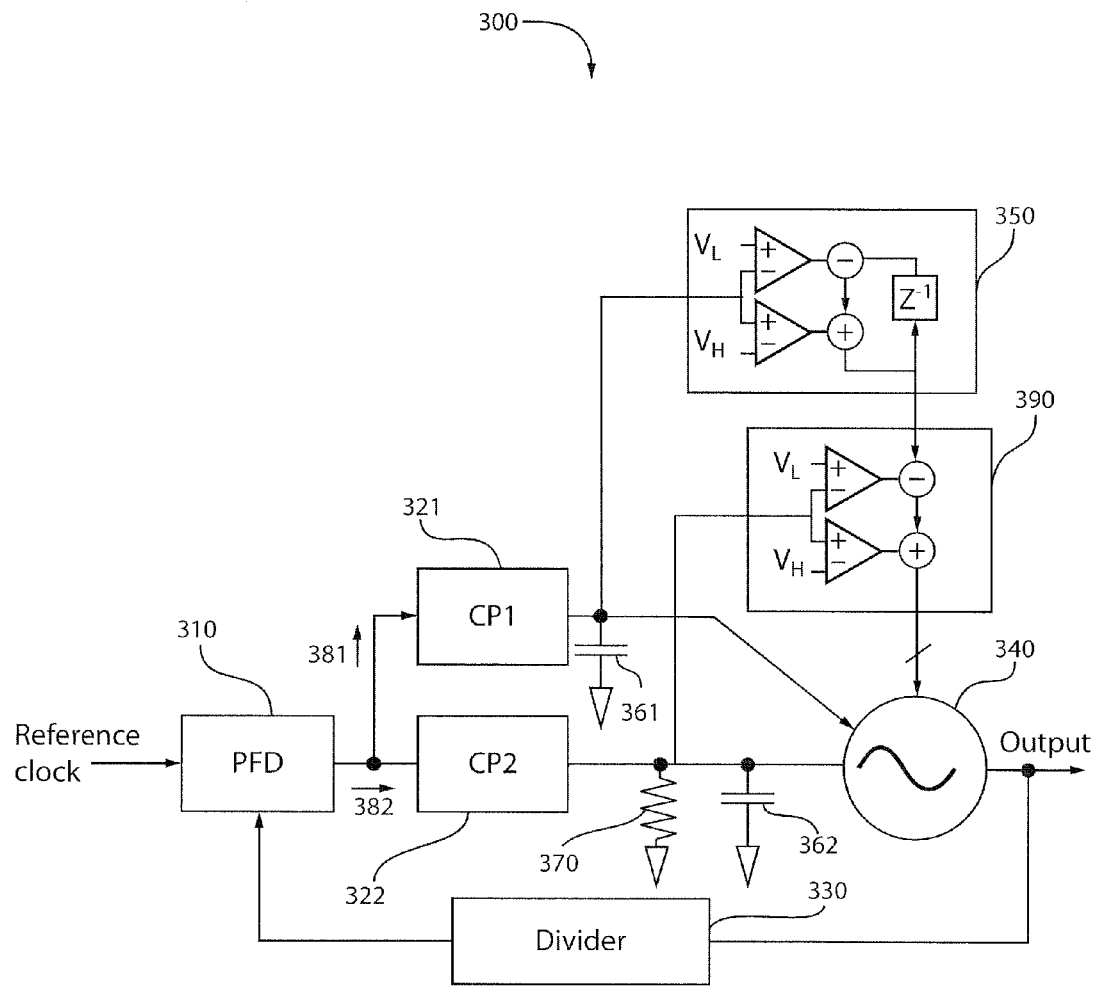
FIG. 3 shows an exemplary dual path analog phase locked loop (PLL) 300, in accordance with an embodiment of the present principles.

FIG. 3 shows an exemplary dual path analog phase locked loop (PLL) 300, in accordance with an embodiment of the present principles. As compared to PLL 100, PLL 300 advantageously includes proportional control path saturation compensation. The PLL 300 includes a phase-frequency detector (PFD) 310, a charge pump 1 (CP1) 321, a charge pump 2 (CP2) 322, a divider 330, a voltage controlled oscillator 340, a coarse band controller 350, a capacitor 361, a capacitor 362, a resistor 370, and a proportional saturation compensator 390.

A proportional control path 382 responds to a phase difference at the input of the PLL 300 by generating a voltage at an input of the VCO 340. If the phase difference goes to zero, then that input of the VCO 340 will go to zero. An integral control path 381 integrates the phase difference at the input of the PLL 300. When the phase difference goes to zero, the integral control path 381 does not go to zero, but maintains its value.

The proportional saturation compensator 390 performs the proportional control path saturation compensation. The proportional saturation compensator 390 includes comparators that are used to detect saturation on the proportional voltage. When the proportional voltage goes above/below a threshold indicating saturation, the VCO coarse band is temporarily incremented/decremented. When the proportional voltage returns to within its non-saturated range, the VCO course band is returned to its original value (i.e., the value of the VCO coarse band immediately prior to any adjustment responsive to saturation). By returning the course band to its original value, there is no memory associated with this switching. This is equivalent to extending the proportional range.

The gain of this extra proportional path can be controlled by modulating the VCO coarse frequency controls between the incremented and original state. This method can be used, for example, in situations where incrementing the coarse control results in a frequency/phase change at the output of the PLL which is larger than required to compensate for the proportional path saturation. In such situations, when proportional path saturation is detected, the coarse bands can toggle between an incremented state and the original state. The result of this toggling is that when saturation is detected, the coarse bands are incremented for a fraction of the time, which results in a reduced average frequency/phase change. When the proportional voltage returns to within its non-saturated range, the coarse band control also return to the non-saturated state.

A typical implementation of a digital PLL is almost identical to FIG. 3 with the following replacements: the PFD (Phase-Frequency Detector) 310 is replaced with a digital phase detector, CP1 321 and capacitor 361 are replaced with a digital integrator, CP2 322 and resistor 370 are replace with a variable gain path, and the VCO 140 is replaced with a DCO (Digitally Controlled Oscillator). In such digital PLL, the same proportional control path saturation compensation can be implemented as that described for the analog PLL 300 shown in FIG. 3. In the case of a digital PLL, a Time-To-Digital (TDC) is used at the input of the PLL (in place of comparators monitoring the proportional voltage in an analog PLL) can be used to detect when the phase goes outside of the linear range of the digital phase detector. In a digital PLL, the phase detector detects whether the reference clock is early or late relative to the divided down output clock. If the phase difference at the input of the digital phase detector is much larger than the phase noise of its input signals, then the digital phase detector will produce the same output irrespective of additional small changes to the phase difference between its inputs. In this case the digital phase detector is said to be saturated.

Figure 4:
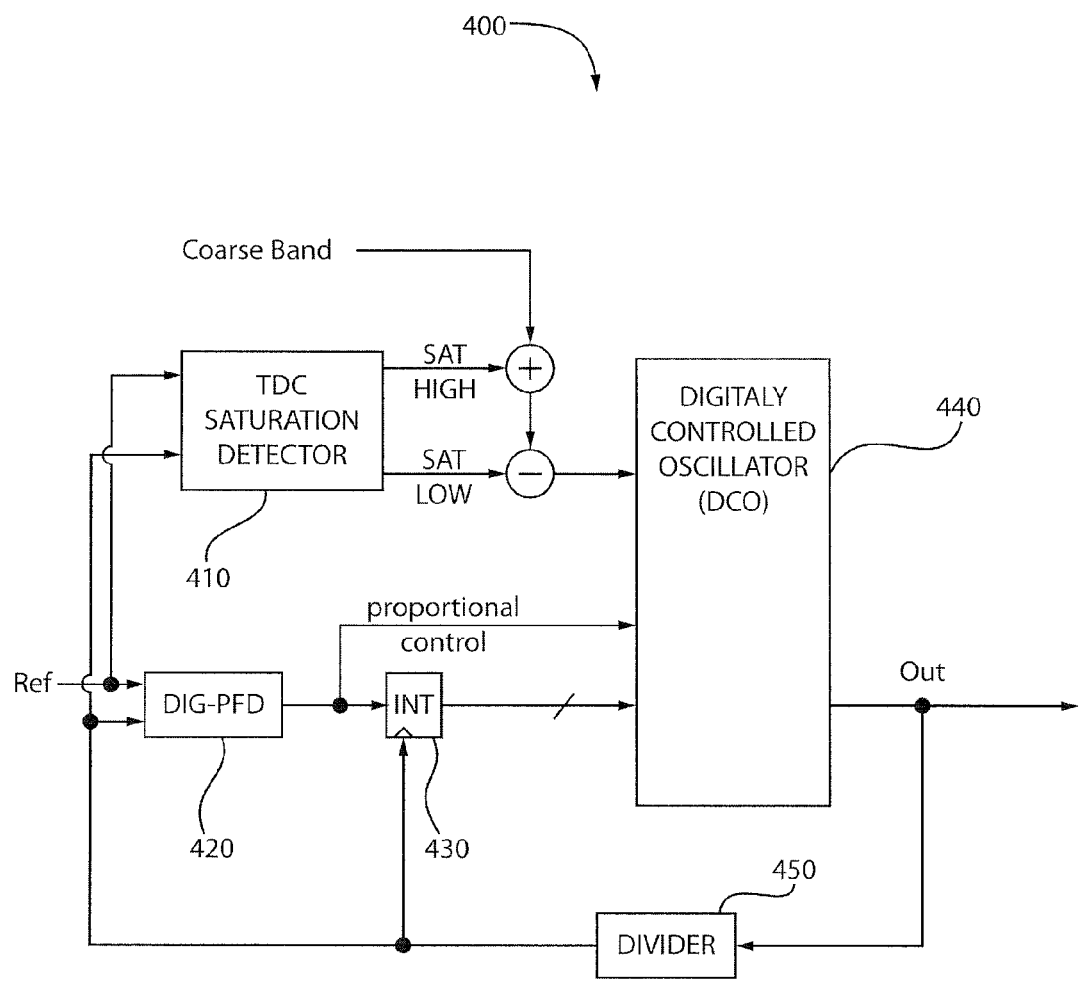
FIG. 4 shows an exemplary dual path digital phase locked loop (PLL) 400, in accordance with an embodiment of the present principles.

FIG. 4 shows an exemplary dual path digital phase locked loop (PLL) 400, in accordance with an embodiment of the present principles. Digital PLL 400 includes a Time-To-Digital (TDC) saturation detector 410, a digital phase frequency detector (PFD) 420, a digital integrator 430, a digitally controlled oscillator (DCO) 440, and a divider 450. Advantageously, the present principles are readily applied to analog PLL 300, digital PLL 400, and variations thereof as readily contemplated by one of ordinary skill in the art.

Figure 5:
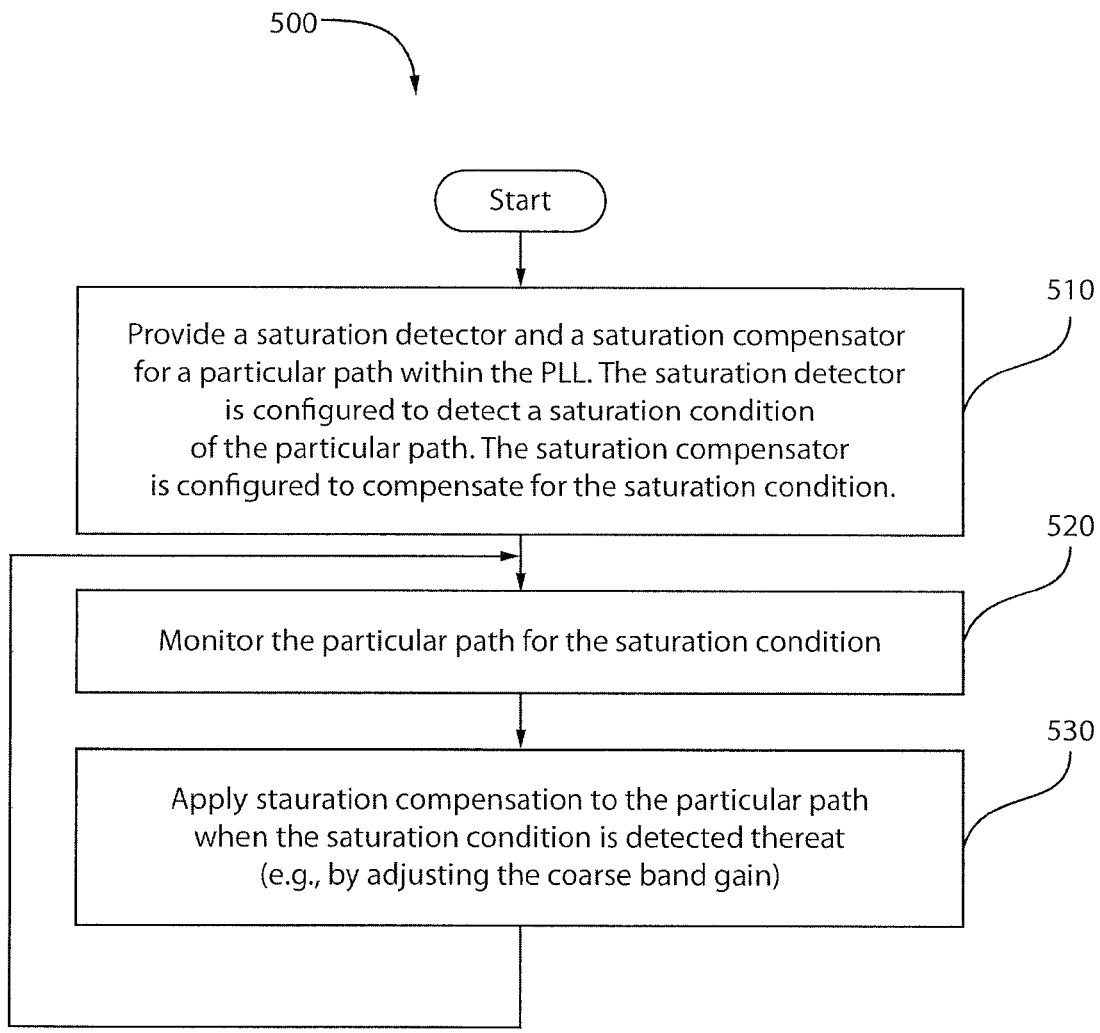
FIG. 5 shows a method 500 for reducing phase lock time (frequency acquisition time) in a phase locked loop (PLL), in accordance with an embodiment of the present principles.

FIG. 5 shows a method 500 for reducing phase lock time (frequency acquisition time) in a phase locked loop (PLL), in accordance with an embodiment of the present principles. It is to be appreciated that method 500 may be used in an analog PLL (such as, e.g., but not limited to dual path analog PLL 300) or a digital PLL (such as, e.g., but not limited to dual path digital PLL 400), while maintaining the spirit of the present principles. At step 510, a saturation detector and a saturation compensator are provided for a particular path within the PLL. The saturation detector is configured to detect a saturation condition of the particular path, and the saturation compensator is configured to compensate for the saturation condition. At step 520, the particular path is monitored for the saturation condition. At step 530, saturation compensation is applied to the particular path when the saturation condition is detected thereat, and the method returns to step 520 so as to continuously monitor the particular path for the presence of the saturation condition. In an embodiment, the saturation detection and saturation compensation can be applied to a proportional control path of the PLL (as compared to the integral control path). In an embodiment, the proportional control path includes a coarse band controller for controlling a coarse band, and the saturation compensation adjusts the coarse band (e.g., the coarse band gain). In an embodiment, the saturation compensation can be realized by changing the relative gain on the particular path.

It is to be appreciated that while a single saturation detector, a single saturation compensator, and a single path are described with respect to method 500, in other embodiments, more than one of these items may also be used, while maintaining the spirit of the present principles. That is, each path for which saturation is to be compensated can include a saturation detector and a saturation compensator. In other embodiments, two or more paths can share a given saturation detector and/or saturation compensator. Given the teachings of the present principles provided here, these and other variations of the present principles are readily contemplated by one of ordinary skill in the art, while maintaining the spirit of the present principles.

Figure 6A:
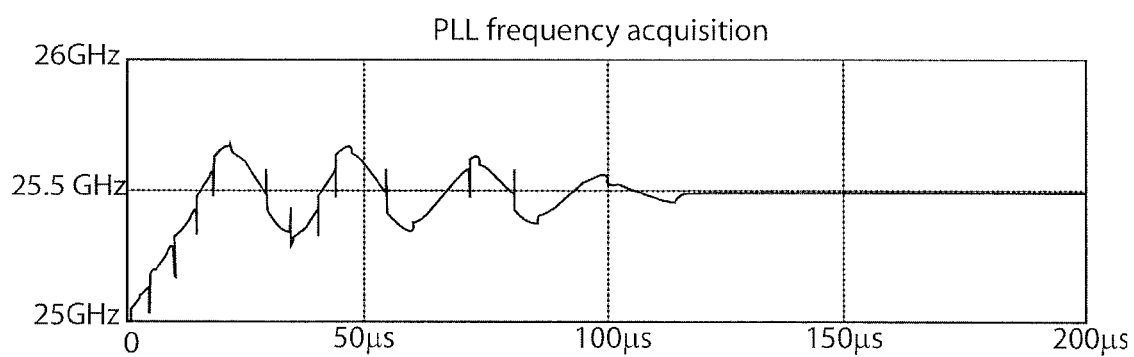
FIG. 6A shows a plot 600 of frequency versus time regarding PLL frequency acquisition, for a PLL in accordance with the prior art.
Figure 6B:
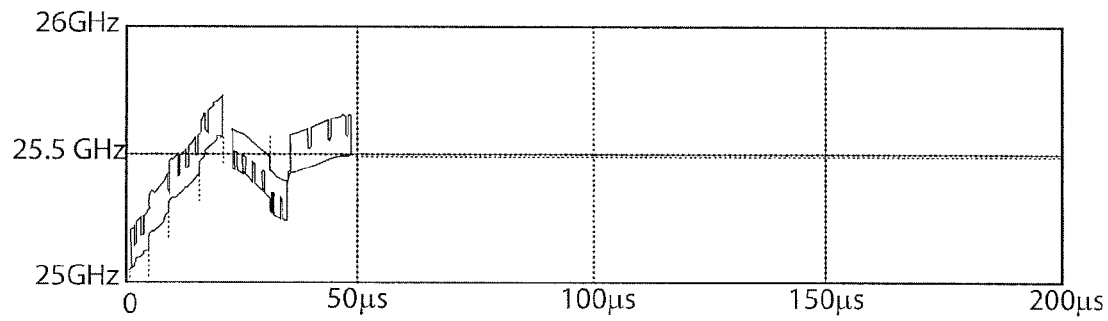
FIG. 6B shows a plot 650 of frequency versus time regarding PLL frequency acquisition, for a PLL in accordance with the present principles.

FIG. 6A shows a plot 600 of frequency versus time regarding PLL frequency acquisition, for a PLL in accordance with the prior art. FIG. 6B shows a plot 650 of frequency versus time regarding PLL frequency acquisition, for a PLL in accordance with the present principles. In both plots 600 and 650, frequency is shown along the Y-axis, and time is shown along the X-axis. The observed ringing in FIG. 6A is due to saturation of the proportional control path in the prior art PLL, which lacks the features of the present principles capable of correcting the same. The settling time using the present principles is reduced by more than a factor of 2, as shown in FIG. 6B as compared to FIG. 6A.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for reducing lock time in a phase locked loop, the method comprising:
    detecting a saturation condition on a path within the phase locked loop; and
    temporarily applying saturation compensation along the path when the saturation condition is detected.

2. The method of claim 1, wherein the phase locked loop has a proportional path and an integral path, and wherein the saturation condition is detected and compensated for on the proportional path.

3. The method of claim 2, wherein the proportional path includes a coarse band controller for controlling an oscillator coarse band, and wherein the saturation compensation adjusts the oscillator coarse band to compensate for the saturation condition.

4. The method of claim 3, wherein the oscillator coarse band is adjusted using memory-less switching.

5. The method of claim 3, wherein the oscillator coarse band is adjusted to a particular compensating value from an original value, the original value corresponding to a non-saturation condition of the path, and wherein the oscillator coarse band is returned to the original value from the particular compensating value when a voltage of the proportional path returns to a non-saturated range.

6. The method of claim 1, wherein the saturation compensation changes the relative gain on the path.

7. The method of claim 6, wherein the path includes a coarse band controller for controlling an oscillator coarse band, and the relative gain on the path is changed by modulating the oscillator coarse band between an incremented state and an original state to provide at least one of a reduced average frequency change and a reduced average phase change over a given time period as compared to using only the incremented state, the original state corresponding to a non-saturation condition of the path.

8. The method of claim 1, wherein the phase locked loop is an analog phase locked loop.

9. The method of claim 1, wherein the phase locked loop is a digital phase locked loop.

10. The method of claim 1, wherein detecting a saturation condition on a path within the phase locked loop comprises using one or more comparators to detect the saturation condition on the path.

11. An apparatus for reducing lock time in a phase locked loop, the apparatus comprising:
a saturation compensator for detecting a saturation condition on a path within the phase locked loop, and temporarily applying saturation compensation along the path when the saturation condition is detected.

12. The apparatus of claim 11, wherein the phase locked loop has a proportional path and an integral path, and wherein the saturation condition is detected and compensated for on the proportional path.

13. The apparatus of claim 12, wherein the proportional path includes a coarse band controller for controlling an oscillator coarse band, and wherein the saturation compensation adjusts the oscillator coarse band to compensate for the saturation condition.

14. The apparatus of claim 13, wherein the oscillator coarse band is adjusted using memory-less switching.

15. The apparatus of claim 13, wherein the oscillator coarse band is adjusted to a particular compensating value from an original value, the original value corresponding to a non-saturation condition of the path, and wherein the oscillator coarse band is returned to the original value from the particular compensating value when a voltage of the proportional path returns to a non-saturated range.

16. The apparatus of claim 11, wherein the saturation compensation changes the relative gain on the path.

17. The apparatus of claim 16, wherein the path includes a coarse band controller for controlling an oscillator coarse band, and the relative gain on the path is changed by modulating the oscillator coarse band between an incremented state and an original state to provide at least one of a reduced average frequency change and a reduced average phase change over a given time period as compared to using only the incremented state, the original state corresponding to a non-saturation condition of the path.

18. The apparatus of claim 11, wherein the phase locked loop is an analog phase locked loop.

19. The apparatus of claim 11, wherein the phase locked loop is a digital phase locked loop.

20. The apparatus of claim 11, wherein the saturation compensator comprises one or more comparators for detecting the saturation condition on the path.

21. A non-transitory computer readable storage medium comprising a computer readable program, wherein the computer readable program when executed on a computer causes the computer to perform the following:
detect a saturation condition on a path within the phase locked loop; and
temporarily apply saturation compensation along the path when the saturation condition is detected.

22. The computer readable storage medium of claim 21, wherein the path includes a coarse band controller for controlling an oscillator coarse band, and wherein the oscillator coarse band is adjusted to compensate for the saturation condition.

23. The computer readable storage medium of claim 22, wherein the oscillator coarse band is adjusted using memory-less switching.

24. The computer readable storage medium of claim 22, wherein the oscillator coarse band is adjusted to a particular compensating value from an original value, the original value corresponding to a non-saturation condition of the path, and wherein the oscillator coarse band is returned to the original value from the particular compensating value when a voltage of the proportional path returns to a non-saturated range.

25. A method for reducing lock time in a phase locked loop having an integral control path and a proportional control path, the method comprising:
detecting a saturation condition on the proportional control path; and
temporarily applying saturation compensation along the proportional control path when the saturation condition is detected by adjusting a relative gain on the proportional control path,
wherein the proportional control path includes a coarse band controller for controlling an oscillator coarse band, and the relative gain on the path is adjusted by modulating the oscillator coarse band between an incremented state and an original state to provide at least one of a reduced average frequency change and a reduced average phase change over a given time period as compared to using only the incremented state, the original state corresponding to a non-saturation condition of the proportional control path.

* * * * *